United States Patent

Block et al.

[11] Patent Number: 5,856,744
[45] Date of Patent: Jan. 5, 1999

[54] METHOD AND APPARATUS FOR $B_0$ EDDY CURRENT COMPENSATION BY $B_1$ PHASE MODULATION

[75] Inventors: Walter F. Block; Adam B. Kerr, both of Palo Alto; John M. Pauly, San Francisco, all of Calif.

[73] Assignee: Board of Trustees of the Leland Stanford Junior University, Palo Alto, Calif.

[21] Appl. No.: 772,684

[22] Filed: Dec. 23, 1996

[51] Int. Cl.$^6$ ....................................................... G01V 3/00

[52] U.S. Cl. ........................................... 324/309; 324/314

[58] Field of Search .................................... 324/314, 309, 324/307, 300, 318, 322

[56] References Cited

U.S. PATENT DOCUMENTS

| 5,289,127 | 2/1994 | Doddrell et al. | 324/314 |
| 5,296,809 | 3/1994 | Roberts et al. | 324/314 |

*Primary Examiner*—Louis M. Arana
*Attorney, Agent, or Firm*—Townsend and Townsend and Crew LLP; Henry K. Woodward

[57] ABSTRACT

In accordance with the invention, spatially invariant $B_0$ eddy currents induced by a slice-selection gradient, $G_Z$ in an MRI system, are compensated by phase modulating the RF excitation pulse with a compensating function. In one embodiment, the compensating function is based on a measure of the integral of the $B_0$ eddy current. In another embodiment, a scaled copy of the excitation gradient can be used as an approximation of the compensating function.

3 Claims, 3 Drawing Sheets

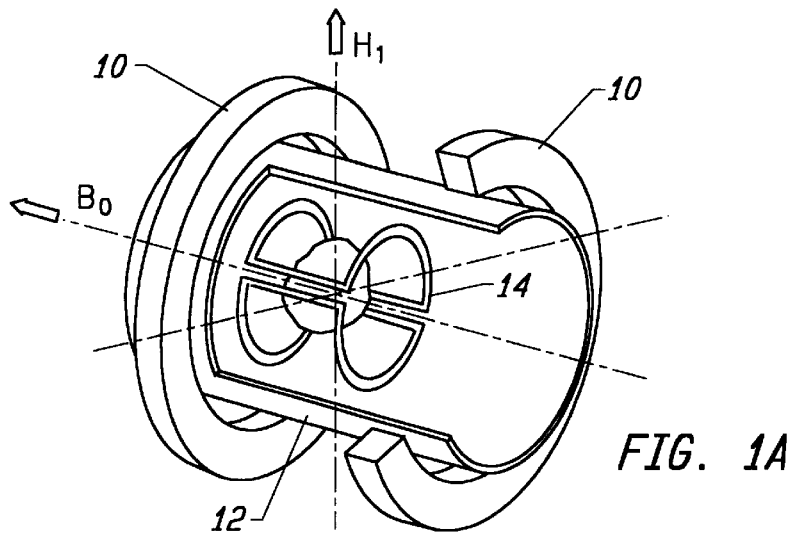
FIG. 1A
FIG. 1B   FIG. 1C   FIG. 1D
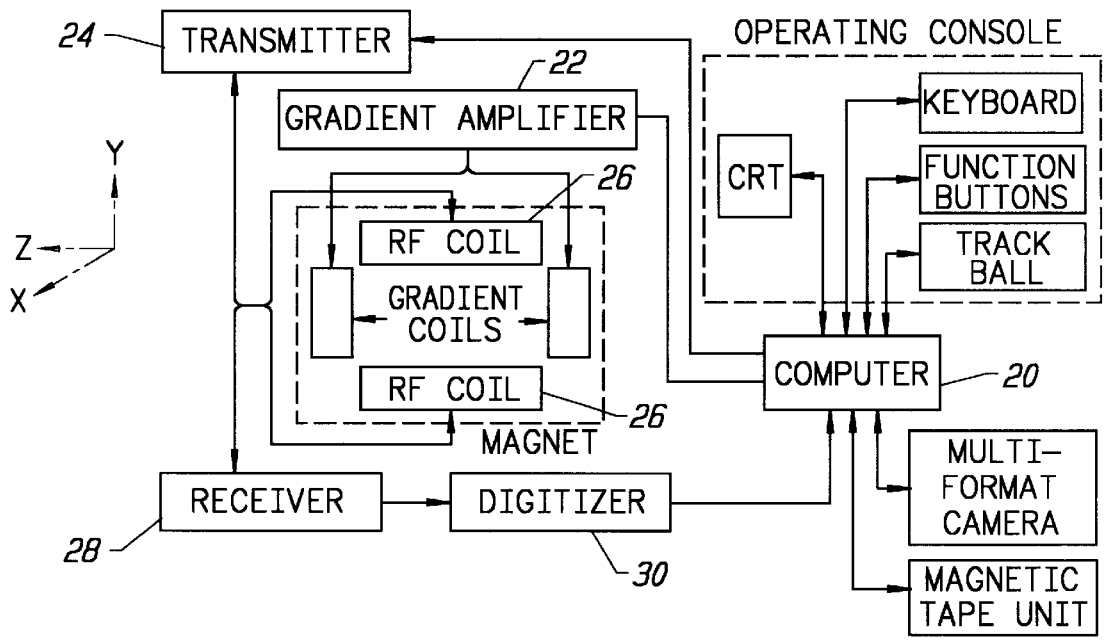
FIG. 2

METHOD AND APPARATUS FOR $B_0$ EDDY CURRENT COMPENSATION BY $B_1$ PHASE MODULATION

The U.S. Government has rights in the invention pursuant to NIH Grant No. RO1CA50948 to Stanford University.

BACKGROUND OF THE INVENTION

This invention relates generally to magnetic resonance imaging, and more particularly the invention relates to the correction of spatially invariant $B_0$ eddy currents by phase modulating a radio-frequency (RF) excitation pulse, $B_1$.

Magnetic resonance imaging (MRI), is a non-destructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signal is provided representing different regions of the volume. These are combined to produce a volumetric image of the nuclear spin density of the body.

Briefly, a strong static magnetic field is employed to line up atoms whose nuclei have an odd number of protons and/or neutrons, that is, have spin angular momentum and a magnetic dipole moment. A second RF magnetic field, applied as a single pulse traverse to the first, is then used to pump energy into these nuclei, flipping them over, for example to 90° or 180°. After excitation, the nuclei gradually return to alignment with the static field and give up the energy in the form of weak but detectable free induction decay (FID). These FID signals are used by a computer to produce images.

The excitation frequency, and the FID frequency, is defined by the Larmor relationship which states that the angular frequency $\omega_0$, of the procession of the nuclei is the product of the magnetic field $B_0$, and the so-called magnetogyric ratio, $\gamma$, a fundamental physical constant for each nuclear species:

$$\omega_0 = B_0 \times \gamma$$

Accordingly, by superimposing a linear gradient field, $B_z = Z \times G_z$, on the same static uniform field, $B_0$, which defines the Z axis, for example, nuclei in a selected X-Y plane can be excited by proper choice of the frequency spectrum of the transverse excitation field applied along the X or Y axis. Similarly, a gradient field can be applied in the X-Y plane during detection of the FID signals to spatially-localize the FID signals in the plane. The angle of nuclear spin flip in response to an RF pulse excitation is proportional to the integral of the pulse over time.

Spectral-spatial excitation is an effective tool for fat suppression in magnetic resonance imaging. See Meyer, et al., "Magnetic Resonance Medicine," 15.28 (1990); however, suppression levels often fail to meet theoretical results. The technique also suffers inconsistent suppression between imaging planes and systems.

We have discovered that the excitation gradient creates a $B_0$ eddy current which phase modulates the excitation, creating a spectral sidelobe near the fat resonant frequency. In accordance with the invention, we provide a simple real-time method to remove the phase modulation, thereby providing consistent performance.

SUMMARY OF THE INVENTION

In accordance with the invention, spatially invariant $B_0$ eddy currents induced by a slice-selection gradient, $G_Z$ in an MRI system, are compensated by phase modulating the RF excitation pulse with a compensating function.

In one embodiment, the compensating function is based on a measure of the integral of the $B_0$ eddy current. In another embodiment, a scaled copy of the excitation gradient can be used as an approximation of the compensating function.

The invention and objects and features thereof will be more readily apparent from the following description and appended claims when taken with the drawings.

BRIEF DESCRIPTION OF THE DRAWINGS

FIGS. 1A, 1B, 1C and 1D illustrate the arrangement of conventional MRI apparatus and magnetic fields generated therein.

FIG. 2 is a functional block diagram of MRI imaging apparatus.

DETAILED DESCRIPTION OF THE PREFERRED EMBODIMENT

Figure 3A:
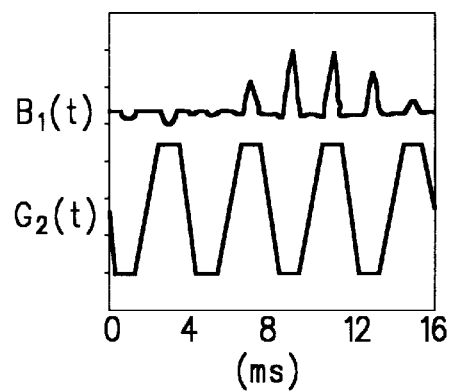
FIGS. 3A and 3B illustrate a typical $B_1(\tau)$ pulse and accompanying $G_z(\tau)$ gradient, and phase induced on the excitation pulse by the eddy currents, respectively.

Referring now to the drawings, FIG. 1A is a perspective view partially in section illustrating coil apparatus in an NMR imaging system, and FIGS. 1B–1D illustrate field gradients which can be produced in the apparatus of FIG. 1A. This apparatus is discussed by Hinshaw and Lent, "An Introduction to NMR Imaging: From the Bloc Equation to the Imaging Equation," Proceedings of the IEEE, Vol. 71, No. 3, March, 1983, pp. 338–350. Briefly, the uniform static field $B_0$ is generated by the magnet comprising the coil pair 10. A gradient field G(x) is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_0$ and varies linearly with distance along the X axis but does not vary with distance along the Y or Z axes. FIGS. 1C and 1D are similar representation of the Y gradient and Z gradient fields, respectively.

FIG. 2 is a functional block diagram of the imaging apparatus as disclosed in *NMR-A Perspective in Imaging,* General Electric Company, 1982. A computer 20 is programmed to control the operation of the NMR apparatus and process FID signals detected therefrom. The gradient field is energized by a gradient amplifier 22, and the RF coils 26. After the selected nuclei have been flipped, the RF coils 26 are employed to detect the FID signal which is passed to the receiver 28 and thence through digitizer 30 for processing by computer 20.

Gradient system imperfections and eddy currents give rise to a time-varying error between prescribed and actual magnetic field which can have a profound effect on image quality in spiral and echo-planar sequences.

As described above, the slice-selection gradient creates a $B_0$ eddy current which phase modulates the excitation pulse, enlarging a spectral sidelobe near the fat resonant frequency (±250 Hz).

Figure 3B:
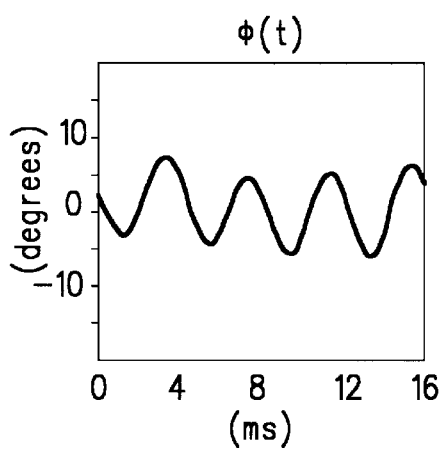
Figure 4B:
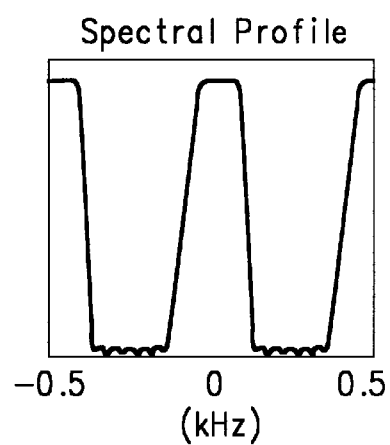

In accordance with the invention, the excitation pulse is phase modulated to compensate for the $B_0$ eddy current phase modulation induced by the slice-selection gradient. The gradient of a typical 1.5T designed pulse $B_1(\tau)$ contains 8 alternating lobes, each of 2 ms duration. (FIG. 3A) The integral $\phi(\tau)$ of the gradient's $B_0$ eddy current, measured by the method described in copending patent application 5490H-025900 is a measure of the phase induced on the excitation pulse (FIG. 3B).

As described therein, time-varying error between a prescribed magnetic field and an actual magnetic field is identified from a self-encoding technique and the measurement of detected responses to various magnetic read-out gradients. The gradients can be a sinusoidal, step function, or other suitable form which enables the actual responses to be obtained from which transfer functions can be defined. In one embodiment, the data can effectively frequency sample the transfer function of the system. A gradient-recalled echo occurs each time the self-encode lobe is refocused, and the phase of the echo peak is used to estimate the phase of the main magnetic field, $B_0(\tau)$. Compensation for the magnetic and gradient errors is done during image reconstruction when measured rather than designed k-space trajectories are used.

To measure the actual fields, a self-encoding technique is employed. A self-encoding gradient lobe moving to $k_0$ in k-space is applied, then data is acquired while applying the slice-select gradient. A gradient-recalled echo occurs each time the self-encode lobe is refocused. These echo times indicate when $k_0$ is reached by the slice select gradient. In practice, multiple self encodes and acquisitions are used, with echo peak interpolation done against self-encode values to determine the actual k-space trajectory. Peak interpolation is performed by fitting a Gaussian curve using least-squares. The method uses the phase of the echo peak $\phi(t)$ to estimate $\phi(t) = \int_0^t \gamma B_0(\tau) d\tau$.

The eddy current induced phase modulation distributes the initial real-valued $B_1(\tau)$ to the real $B_{1x}(\tau)$ and imaginary $B_{1y}(\tau)$ channels.

$$B_{1x}(\tau) = B_1(\tau)\cos(\phi(\tau)) \quad (1)$$

$$B_{1y}(\tau) = B_1(\tau)\sin(\phi(\tau)) \quad (2)$$

Figure 4A:
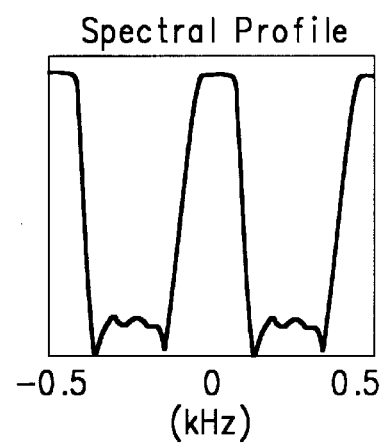
FIGS. 4A and 4B illustrate spectral lobes with sidelobes created at ±250 Hz before correction and after correction, respectively.

$\phi(\tau)$ functions for these gradients are approximately limited to ±20° on reasonably tuned systems. Since $\cos\phi(\tau) \approx 1$, $B_{1x}(\tau)$ differs only slightly in amplitude from $B_1(\tau)$. The main spectral lobe, seen in FIG. 4A is minimally affected. Since $\sin\phi(\tau)$ alternates sign with each gradient lobe, every other lobe of $B_{1y}(\tau)$ is inverted. The imaginary channel enlarges a spectral sidelobe centered at 250 Hz since the lobes of $B_{1y}(\tau)$ invert every 4 ms. This sidelobe degrades the designed null near the 1.5T fat resonant frequency (FIG. 4A). Thus the eddy current magnitude determines fat suppression yet has little effect on water excitation.

The function $\phi(\tau)$ is collected once per axis per system at one slice-select gradient amplitude. To correct the $B_0$ induced phase modulation for a given axis, we phase modulate the initial pulse $B_1(\tau)$ with the corresponding function $-\phi(\tau)$. If $\phi(\tau)$ cannot be acquired, a scaled copy of the gradient can approximate it. Scaling is empirically adjusted for the best fat suppression.

Since the eddy current is linear with gradient amplitude, the applied phase correction will scale linearly with gradient amplitude. Thus, we need only one measurement for each axis. For oblique slices, the necessary phase correction is a linear combination of the phase corrections derived for each physical gradient's component of the slice-select waveform.

Figures 5A, 5B:
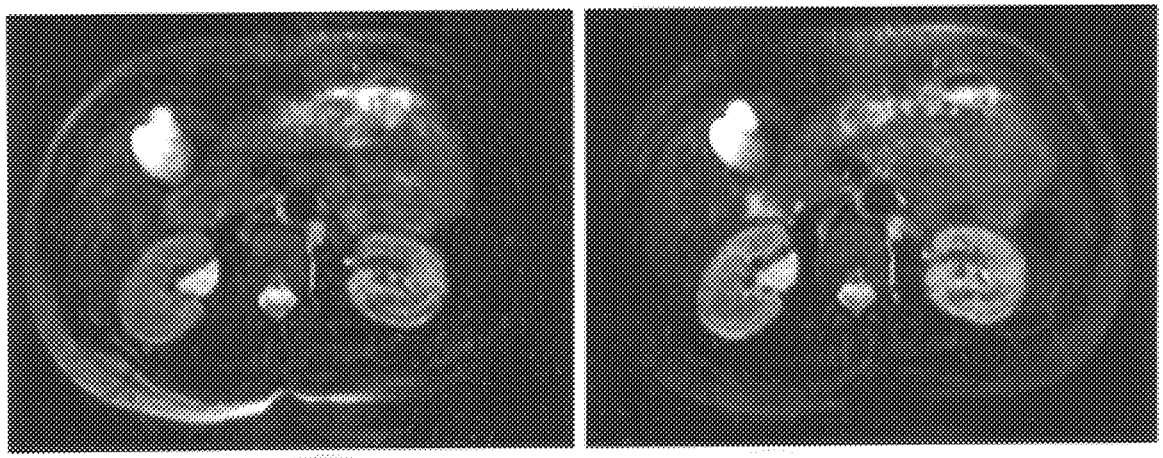
FIGS. 5A and 5B are $T_2$-weighted abdominal images acquired with a convention spectral spatial excitation, and with eddy current compensation in accordance with the invention, respectively.

FIG. 5A shows a $T_2$-weighted abdominal image acquired with a conventional spectral spatial excitation. FIG. 5B shows the same slice acquired with the pulse precorrected for $B_0$ eddy currents. Notice the consistent sub-cutaneous fat suppression in this image.

In summary, $B_0$ eddy currents enlarge an undesired spectral sidelobe on spectral spatial pulses. In accordance with the invention, this sidelobe can be corrected through compensation of the pulse. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of improving spectral-spatial excitation in magnetic resonance imaging comprising the steps of:
   a) placing an object to be imaged in a static magnetic field ($B_0$),
   b) applying a phase modulated RF excitation pulse to said object, the phase modulation being based on an empirically adjusted scaled copy of a slice-selection gradient whereby said RF excitation pulse providing spectral-spatial excitation to image tissue which suppresses fat, the phases modulation compensation for $B_0$ eddy current phase modulation of the RF excitation pulse, and
   c) detecting signals emitted from said object.

2. Apparatus for use in providing improved spectral-spatial excitation in magnetic resonance imaging of an object comprising
   a) means for establishing a static magnetic field ($B_0$ through the object,
   b) means for applying a phase modulated RF excitation pulse to said object, the phase modulation being based on an empirically adjusted scaled copy of a slice-selection gradient whereby said RF excitation pulse providing spectral-spatial excitation to image tissue which suppresses fat, the phases modulation compensation for $B_0$ eddy current phase modulation of the RF excitation pulse, and
   c) detecting signals emitted from said object.

3. Apparatus as defined by claim 2 and further including means for providing an image using the detected signals.

* * * * *